US012563793B2

(12) United States Patent
Chen

(10) Patent No.: US 12,563,793 B2
(45) Date of Patent: Feb. 24, 2026

(54) SUPER JUNCTION TRENCH MOSFET AND METHOD FOR PREPARING SAME

(71) Applicant: Alkaid-Semi Technologies (Shanghai) Co., Ltd, Shanghai (CN)

(72) Inventor: Kaiyu Chen, Shanghai (CN)

(73) Assignee: ALKAIDSEMI (SHANGHAI) TECHNOLOGIES CORPORATION, Shanghai (CN)

( * ) Notice: Subject to any disclaimer, the term of this patent is extended or adjusted under 35 U.S.C. 154(b) by 240 days.

(21) Appl. No.: 18/385,390

(22) Filed: Oct. 31, 2023

(65) Prior Publication Data

US 2024/0145534 A1 May 2, 2024

(30) Foreign Application Priority Data

Nov. 2, 2022 (CN) .......................... 202211360807.7

(51) Int. Cl.
H10D 62/10 (2025.01)
H01L 21/02 (2006.01)
H10D 64/27 (2025.01)

(52) U.S. Cl.
CPC ...... H10D 62/111 (2025.01); H01L 21/02293 (2013.01); H01L 21/0257 (2013.01); H01L 21/02634 (2013.01); H10D 64/513 (2025.01)

(58) Field of Classification Search
CPC ................ H10D 62/109; H10D 62/111; H01L 21/02293; H01L 21/02634; H01L 21/0257
See application file for complete search history.

(56) References Cited

U.S. PATENT DOCUMENTS

| | | | | |
|---|---|---|---|---|
| 2005/0221547 A1 * | 10/2005 | Yamauchi | ............ | H10D 62/051 |
| | | | | 257/E21.629 |
| 2007/0072398 A1 * | 3/2007 | Shibata | ............... | H01L 21/0262 |
| | | | | 438/478 |
| 2010/0314682 A1 | 12/2010 | Yilmaz et al. | | |
| 2013/0149838 A1 * | 6/2013 | Saggio | .............. | H01L 21/02532 |
| | | | | 438/429 |

FOREIGN PATENT DOCUMENTS

CN        111403267 A  *  7/2020   ........... H10D 62/111

* cited by examiner

*Primary Examiner* — Joseph C. Nicely
(74) *Attorney, Agent, or Firm* — IPRTOP LLC

(57) ABSTRACT

A method for preparing a super junction trench MOSFET, comprising: providing a substrate, and forming a first trench in the substrate; depositing an epitaxial portion of a first stage in the first trench while supplying a doped gas and an etching gas, and performing an epitaxial process after stopping supplying the doped gas and the etching gas, wherein impurities in the epitaxial portion of the first stage are diffused to an upper portion of the first trench and to form an epitaxial portion of a second stage with a gradient concentration by utilizing a high-temperature environment of the epitaxial process; forming a well region, a trench gate, and an active region in the substrate at a periphery of the first trench; forming an interlayer dielectric layer covering the column, the trench gate, and the active region; and electrically leading out the column, the trench gate, and the active region.

9 Claims, 5 Drawing Sheets

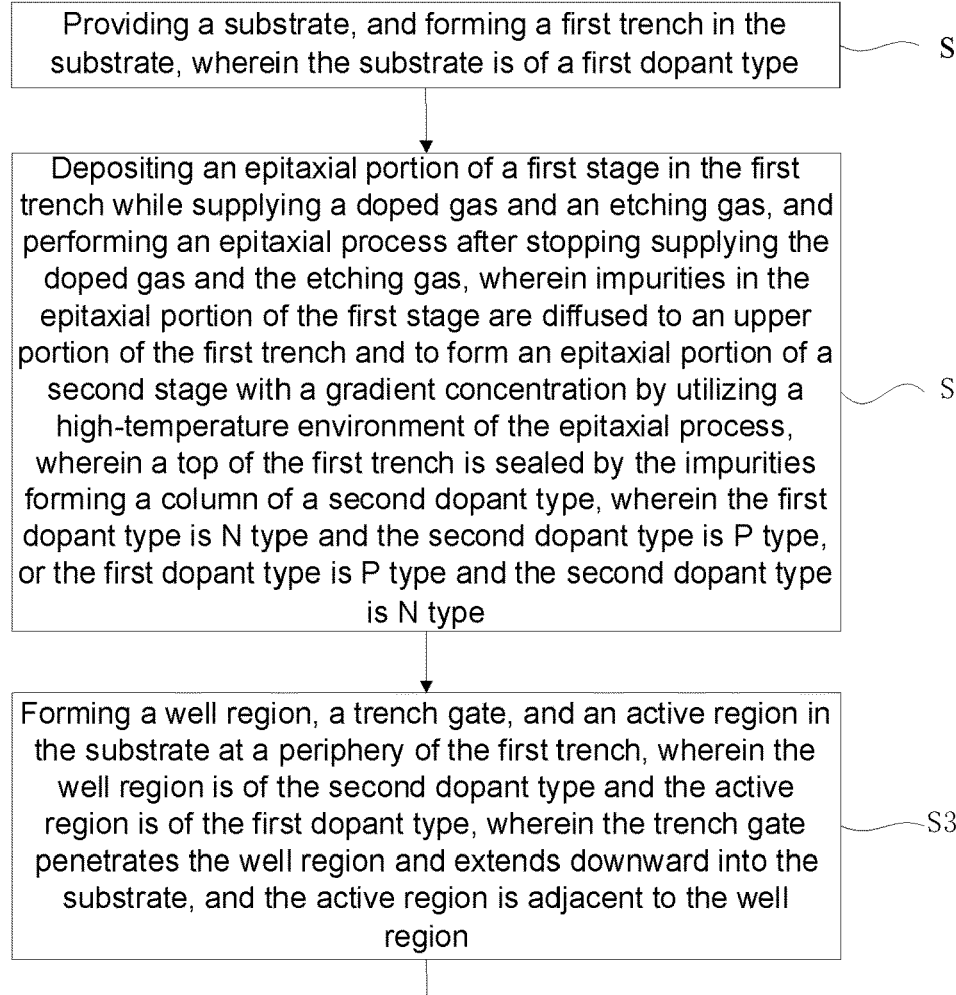

| Providing a substrate, and forming a first trench in the substrate, wherein the substrate is of a first dopant type | S1 |

Depositing an epitaxial portion of a first stage in the first trench while supplying a doped gas and an etching gas, and performing an epitaxial process after stopping supplying the doped gas and the etching gas, wherein impurities in the epitaxial portion of the first stage are diffused to an upper portion of the first trench and to form an epitaxial portion of a second stage with a gradient concentration by utilizing a high-temperature environment of the epitaxial process, wherein a top of the first trench is sealed by the impurities forming a column of a second dopant type, wherein the first dopant type is N type and the second dopant type is P type, or the first dopant type is P type and the second dopant type is N type — S2

Forming a well region, a trench gate, and an active region in the substrate at a periphery of the first trench, wherein the well region is of the second dopant type and the active region is of the first dopant type, wherein the trench gate penetrates the well region and extends downward into the substrate, and the active region is adjacent to the well region — S3

Forming an interlayer dielectric layer covering the column, the trench gate, and the active region — S4

Electrically leading out the column, the trench gate, and the active region — S5

FIG. 1

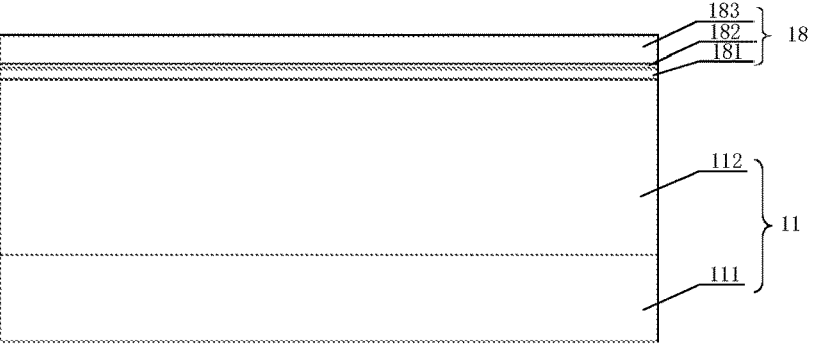

SUPER JUNCTION TRENCH MOSFET AND METHOD FOR PREPARING SAME

CROSS REFERENCE TO RELATED APPLICATION

The present application claims the benefit of priority to Chinese Patent Application No. CN 2022113608077, entitled "SUPER JUNCTION TRENCH MOSFET AND METHOD FOR PREPARING SAME", filed with CNIPA on Nov. 2, 2022, the disclosure of which is incorporated herein by reference in its entirety.

FIELD OF TECHNOLOGY

The present disclosure relates to the technical field of preparing semiconductor devices, and in particular, to a super junction trench MOSFET and a method for preparing the same.

BACKGROUND

Super junction trench MOSFET is an advanced power MOSFET technology. It works by introducing a vertical P-pillar and an N-type epitaxial region to form a space charge region through depletion. When the super junction trench MOSFET is subject to a reverse voltage, the tendency towards charge balance between the N-type epitaxial portion and the P-pillar will expand the depletion region, increasing the breakdown voltage. Therefore, by adjusting dopant concentration of the N-type epitaxial portion, the conduction resistance during operation can be reduced while maintaining the breakdown voltage, thereby improving system efficiency.

A P-pillar in an existing super junction trench MOSFET is obtained by first etching the N-type epitaxial portion to obtain a deep trench and then filling the deep trench to form a P-type epitaxial portion. However, since the trench depth can reach 40-60 um while the trench width is only a few micrometers, conventional epitaxial filling cannot meet its depth-to-width ratio. Therefore, traditional deep-trench epitaxial filling is carried out by etching and filling synchronously, causing the epitaxial portion to grow upward from the bottom of the deep trench. Although this method has good filling effect, it takes as long as 30-60 minutes for a single chip process and voids are easily formed in the epitaxial portion when sealing the top of the deep trench, leading to degradation of the final product's electrical performance.

SUMMARY

In view of the above-mentioned defects, the present disclosure provides a super junction trench MOSFET and a method for preparing the same.

The method for preparing the super junction trench MOSFET comprises: providing a substrate, and forming a first trench in the substrate, wherein the substrate is of a first dopant type; depositing an epitaxial portion of a first stage in the first trench while supplying a doped gas and an etching gas, and performing an epitaxial process after stopping supplying the doped gas and the etching gas, wherein impurities in the epitaxial portion of the first stage are diffused to an upper portion of the first trench and to form an epitaxial portion of a second stage with a gradient concentration by utilizing a high-temperature environment of the epitaxial process, wherein a top of the first trench is sealed by the impurities forming a column of a second dopant type, wherein the first dopant type is N type and the second dopant type is P type, or the first dopant type is P type and the second dopant type is N type; forming a well region, a trench gate, and an active region in the substrate at a periphery of the first trench, wherein the well region is of the second dopant type and the active region is of the first dopant type, wherein the trench gate penetrates the well region and extends downward into the substrate, and the active region is adjacent to the well region; forming an interlayer dielectric layer covering the column, the trench gate, and the active region; and electrically leading out the column, the trench gate, and the active region.

Optionally, forming the first trench in the substrate comprises: forming a first hard mask layer with an ONO structure on the substrate; defining an area of the first trench by utilizing the first hard mask layer, and etching the area of the first trench to form the first trench; and removing a residual part of the first hard mask layer.

Optionally, forming the trench gate in the substrate at the periphery of the first trench comprises: forming a second hard mask layer covering the well region and the column; defining an area of a second trench by utilizing the second hard mask layer, and etching the area of the second trench to form the second trench; forming a gate oxide layer on an inner surface of the second trench; filling polysilicon on an inner surface of the gate oxide layer to obtain a polysilicon layer, wherein the trench gate comprises the gate oxide layer and the polysilicon layer; and performing a surface planarization process to expose an upper surface of the trench gate.

Optionally, the interlayer dielectric layer comprises a silicon dioxide layer and a boron-phosphorus-silicon glass layer, wherein a thickness of the silicon dioxide layer is 2000-2500 angstroms.

Optionally, a thickness of the boron-phosphorus-silicon glass layer is 8000-9000 angstroms.

Optionally, electrically leading out the column, the trench gate, and the active region comprises: forming a plurality of contact holes in the interlayer dielectric layer to expose the trench gate and the column; forming an adhesion layer and an interconnection metal layer in sequence over the contact holes; forming a front metal layer covering the column and the contact holes; and forming a passivation layer over the front metal layer, and forming a pad window penetrating the passivation layer.

Optionally, the adhesion layer comprises a titanium layer and/or a titanium nitride layer, the interconnection metal layer comprises a tungsten layer or a copper layer, the passivation layer comprises a silicon nitride layer, and the front metal layer comprises an aluminum-copper alloy layer.

Optionally, the method further comprises: performing thinning and backside metallization processes in sequence on a surface of the substrate facing away from the column.

Optionally, a thickness of the epitaxial portion of the first stage is 25%-40% of a depth of the first trench.

Optionally, during the first stage, a flow rate of the doped gas is 700-1000 sccm, a flow rate of the etching gas is 1200-1400 sccm, and a duration for deposition is 1 μm/deposition rate.

Optionally, the super junction trench MOSFET is prepared by utilizing a method according to any of the above schemes.

As described above, the super junction trench MOSFET and the method provided by the present disclosure have the following beneficial effects: the method takes advantages of both trench epitaxial growth and characteristics of super junction devices, and divides the trench epitaxial growth into two stages. The epitaxial portion of the first stage and the column are in charge balance, and the top of the trench is sealed during the second stage. The above-mentioned method can greatly reduce the process time, lower production costs, and prevent voids forming at the epitaxial portion when sealing the top of the deep trench, which leads to a column with better morphology and higher quality, thereby improving the performance of the device.

BRIEF DESCRIPTION OF THE DRAWINGS

FIG. 1 shows a flow chart illustrating a method for preparing a super junction trench MOSFET of the present disclosure.

FIG. 2 shows a schematic structural diagram illustrating a step of forming a first hard mask layer on a substrate.

DETAILED DESCRIPTION

Figure 3:
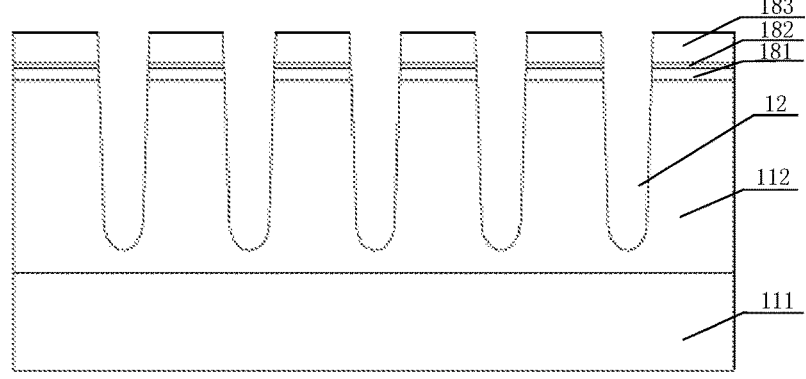
FIG. 3 shows a schematic structural diagram illustrating a step of forming a first trench.

The embodiments of the present disclosure will be described below. Those skilled can easily understand disclosure advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. For example, when the embodiments of the present disclosure are described in detail, for ease of description, the cross-sectional view showing the device structure will not be partially enlarged according to the general scale, and the schematic diagram is only an example, which should not limit the scope of protection. In addition, the actual production should include the length, width and depth of the three-dimensional space dimensions.

For the convenience of description, spatial relation terms such as "below", "under", "beneath", "on", "above", "up", etc. may be used herein to describe the relationships between an element or feature and other elements or features. It will be understood that these spatial relationship terms are intended to encompass directions/orientations of the device in use or operation other than those depicted in the drawings. In addition, when a first layer is referred to as being "between" a second layer and a third layer, the first layer may be the only layer between the second and third layers, or there may more layers between the two layers.

In the context of this disclosure, the structure described with a first feature "on top" of a second feature may include embodiments where the first and second features are formed in direct contact, or it may include embodiments where additional features are formed between the first and second features such that the first and second features are not in direct contact.

It should be noted that the drawings provided in this disclosure only illustrate the basic concept of the present disclosure in a schematic way, so the drawings only show the components closely related to the present disclosure. The drawings are not necessarily drawn according to the number, shape and size of the components in actual implementation; during the actual implementation, the type, quantity and proportion of each component can be changed as needed, and the components' layout may also be more complicated. To make the illustration as concise as possible, not all structures are marked in the drawings.

In existing technologies, a P-pillar of a super junction trench MOSFET is formed by etching and filling at the same time, which leads to the epitaxial portion growing upward from the bottom of the deep trench to complete the filling process. When the deep trench has a large depth-to-width ratio, this method takes as long as 30-60 minutes to complete the process for a single chip. Additionally, voids are easily generated at the epitaxial portion at the sealed top of the deep trench, which deteriorates the final product's electrical performance. In light of this, the inventors have conducted extensive research and proposed a solution for improvement.

Specifically, as shown in FIG. 1, the present disclosure provides a method for preparing a super junction trench MOSFET, and the method will be further described in detail below with reference to FIGS. 2 to 15.

First, step S1 comprises: providing a substrate 11, and forming a first trench 12 in the substrate 11, wherein the substrate 11 is of a first dopant type.

The substrate 11 may be fully made of epitaxial materials, or may comprise a base 111 and an epitaxial layer 112. The base 111 is made of a semiconductor material such as silicon or germanium silicon, and the epitaxial layer 112 is located over a surface of the base 111 and is of the first dopant type. A buffer layer (not shown) may also be formed between the base 111 and the epitaxial layer 112, and the buffer layer is of the same dopant type as the epitaxial layer 112, but a doping concentration of the buffer layer is less than that of the epitaxial layer 112. The buffer layer may prevent impurities in the epitaxial layer 112 from diffusing into the base 111 during a high-temperature process. Before performing subsequent processes, the substrate 11 may be cleansed first. For example, an organic solvent such as acetone and deionized water are sequentially used for cleansing to remove pollutants on the substrate 11, and then the substrate 11 is dried. Alternatively, a natural oxide layer on the surface of the substrate 11 is removed by using a diluted acid solution, and then the substrate 11 is cleansed with deionized water and then dried. Alternatively, the substrate 11 may be cleansed multiple times by using the foregoing cleansing methods.

In a preferred example, forming the first trench 12 in the substrate 11 comprises:

forming a mask layer over the substrate 11 to obtain a structure as shown in FIG. 2. Preferably, the mask layer is a hard mask layer, which helps to improve the etching precision. In one embodiment, the hard mask layer is provided with an ONO structure, which is defined as a first hard mask layer 18. The first hard mask layer 18 comprises a silicon dioxide layer 181, a silicon nitride layer 182, and a silicon dioxide layer 183, which are sequentially arranged from bottom to top. A thickness of the silicon dioxide layer 183 is generally greater than that of the silicon dioxide layer 181. Each layer of the first hard mask layer 18 may be formed in sequence by utilizing a chemical vapor deposition process. Alternatively, the silicon dioxide layer 181 may be formed by utilizing a thermal oxidation process, and the silicon nitride layer 182 and the silicon dioxide layer 183 may be formed by a chemical vapor deposition process. For the first hard mask layer 18 with the ONO structure, the silicon dioxide layer 181 is configured as a buffer layer to buffer stresses between the silicon nitride layer 182 and the substrate 11, and the silicon nitride layer 182 is configured as an etching stop layer of the silicon dioxide layer 183. When the first trench 12 is defined in the first hard mask layer 18, the silicon dioxide layer 183 is consumed as a hard mask when etching to obtain the first trench 12 in the substrate 11. Therefore, the first hard mask layer 18 with the ONO structure helps to improve the etching precision and protect the substrate 11.

When the first hard mask layer 18 is formed, an area of the first trench 12 is defined by utilizing the first hard mask layer 18, and the area of the first trench 12 is etched to form the first trench 12, as shown in FIG. 3. A residual part of the first hard mask layer 18 may be removed by utilizing, but not limited to, an etching process. A depth of the first trench 12 is generally less than a thickness of the epitaxial layer 112, so that a bottom of a column 13 of a second dopant type formed in the subsequent processes is spaced apart from the base 111.

Step S2 comprises: depositing an epitaxial portion of a first stage in the first trench 12 while supplying a doped gas and an etching gas, and performing an epitaxial process after stopping supplying the doped gas and the etching gas. Impurities in the epitaxial portion of the first stage are diffused to an upper portion of the first trench 12 and to form an epitaxial portion of a second stage with a gradient concentration by utilizing a high-temperature environment of the epitaxial process. A top of the first trench 12 is sealed by the impurities forming the column 13 of the second dopant type. The first dopant type is N type and the second dopant type is P type, or the first dopant type is P type and the second dopant type is N type. For example, when the epitaxial layer 112 is of the N type, the column formed is a P-type column. There is usually a plurality of P-type columns, which are distributed in the epitaxial layer 112 at intervals to form a super-junction structure. In step S2, the first trench 12 is filled by utilizing a traditional epitaxial method to form the epitaxial portion of the first stage, which has a certain thickness and covers a bottom and sidewall of the first trench 12. Specifically, the first trench 12 is not completely filled by the epitaxial portion of the first stage. During the second stage, the first trench 12 is only supplied with an epitaxial reaction gas and kept in the high-temperature environment of the epitaxial process. Specifically, the difference between the first and second stages is that the doped gas, the etching gas, and the epitaxial reaction gas are supplied to the first trench 12 during the first stage, while only the epitaxial reaction gas is supplied during the second stage. Other process conditions, such as a flow rate of the epitaxial reaction gas, temperature, and vacuum degree in these two stages, are the same. When the high-temperature environment of the epitaxial process is between 800 and 1200° C., such as 800, 900, 1000, 1100, 1200, or any value between 800 and 1200° C.; the impurities in the epitaxial portion of the first stage are diffused into the epitaxial portion of the second stage according to the Fick Law. As the epitaxial portion of the second stage grows quickly at an opening of the top of the first trench 12, the top of the first trench 12 is sealed by the impurities, thereby forming the epitaxial portion of the second stage with a gradient concentration and an air gap. In step S2, a thickness of the epitaxial portion of the first stage is important. If the thickness is too small, the top of the first trench 12 will be difficult to be sealed during the second stage, and if the thickness is too large, a duration for filling the first trench 12 is too long and the gradient concentration is difficult to form. Inventors of the present disclosure, after extensive experiments, discovered that the thickness of the epitaxial portion of the first stage is preferably 25%-40% of the depth of the first trench 12. When the depth of the first trench 12 is 4 μm, the thickness of the epitaxial portion of the first stage is preferably 1-1.6 μm. Optionally, the epitaxial process of the first stage may also be controlled by managing a duration for supplying the doped gas and the etching gas during the first stage. For example, a duration for deposition is 1 μm/deposition rate. According to conventional epitaxial equipment, the duration of the first stage is about 600 seconds, and that of the second stage is about 300 seconds. A flow rate of the doped gas during the first stage is determined by the required epitaxial concentration.

Preferably, in one embodiment, the flow rate of the doped gas is 700-1000 sccm, more preferably 800 sccm. A flow rate of the etching gas is 1200-1400 sccm, more preferably 1300 sccm. The flow rates of the doped gas and the etching gas are zero during the second stage. Preferably, the depth-to-width ratio of the first trench 12 is greater than 5. The larger the depth-to-width ratio, the shorter the duration for filling the first trench 12, which has more prominent advantages. The epitaxial reaction gas can be selected as needed. For example, silane can be used for a silicon epitaxy, while germane can be used for a germanium epitaxy. A gas containing nitrogen (N), aluminum (Al), or boron (B) can be used as the doped gas for depositing an N-type epitaxial layer. Hydrochloric acid gas can be used as the etching gas. In addition, in traditional epitaxial processes, the flow rate of the etching gas is increased during the second stage to make sure that the entire trench is filled, for example, the flow rate of the etching gas is increased to 1800 sccm. However, this causes the overall epitaxial growth rate to decrease significantly, the sidewall of the trench almost does not grow, the epitaxial portion only grows upward from the bottom of the trench and it takes more than 30 minutes to complete the filling of the trench. Therefore, the traditional epitaxial processes are generally used for planar epitaxial growth to directly and quickly seal the trench, resulting in a column formed with different widths at its top and bottom. Having a column with such a structure makes it difficult to maintain charge balance between the column and the N-type epitaxial layer 112, which makes super-junction characteristics unachievable.

In contrast, the method of the present disclosure takes advantages of both trench epitaxial growth and characteristics of super junction devices, and divides the trench epitaxial growth into two stages. The epitaxial portion of the first stage and the column 13 of the second dopant type are in charge balance, and the top of the trench is sealed during the second stage. The thickness of the epitaxial portion of the first stage is about 1 μm. The above-mentioned method can greatly reduce the process time, lower production costs, and prevent voids forming at the epitaxial portion when sealing the top of the deep trench, which leads to a column with better morphology and higher quality, thereby improving the performance of the device.

Figure 4:
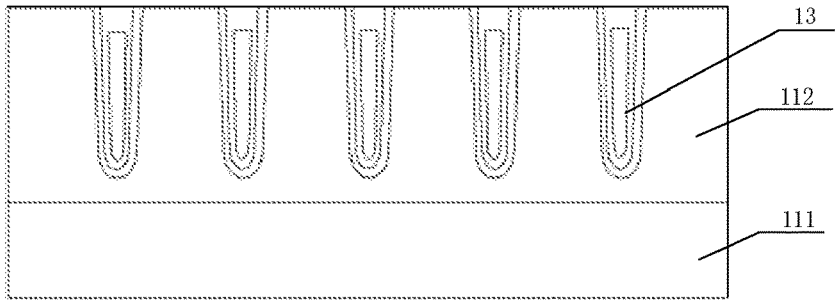
FIG. 4 shows a schematic structural diagram illustrating a step of forming a column of a second dopant type.

When the first trench 12 is filled, a surface planarization process is performed on an epitaxial portion of the substrate 11 at a periphery of the first trench 12 by utilizing a chemical-mechanical polishing process, so as to expose the substrate 11. An upper surface of the column 13 of the second dopant type is flush with an upper surface of the substrate 11 at a periphery of the first trench 12, as shown in FIG. 4.

Figure 5:
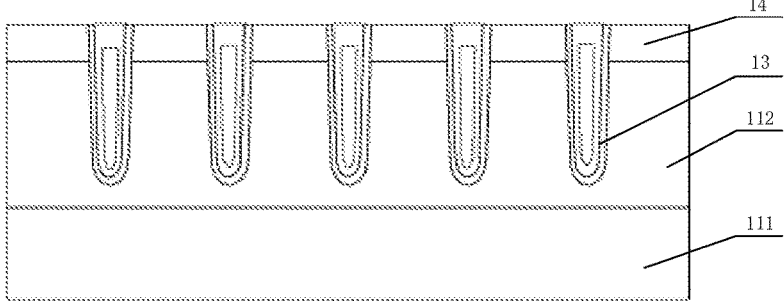
FIG. 5 shows a schematic structural diagram illustrating a step of forming a well region.

Step S3 comprises: forming a well region 14, a trench gate 15, and an active region 16 in the substrate 11 at the periphery of the first trench 12. The well region is formed by utilizing an ion implantation process and high-temperature environment and is of the second dopant type, as shown in FIG. 5. The trench gate 15 penetrates the well region 14 and extends downward into the substrate 11. The active region 16 is adjacent to the well region 14 and is of the first dopant type.

Figure 6:
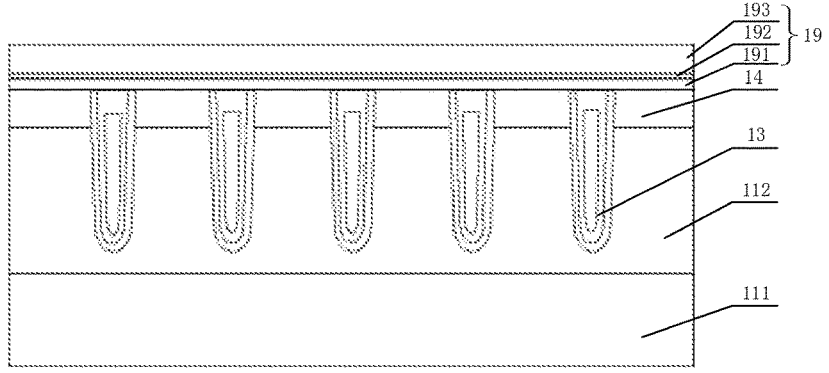
FIG. 6 shows a schematic structural diagram illustrating a step of forming a second hard mask layer.
Figure 7:
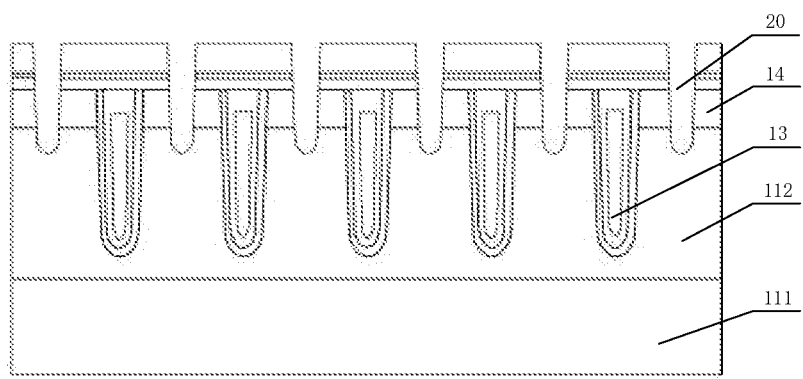
FIG. 7 shows a schematic structural diagram illustrating a step of forming a second trench.

In one embodiment, forming the trench gate 15 in the substrate 11 at the periphery of the first trench 12 comprises:

forming a mask layer covering the well region 14 and the column 13, wherein preferably, the mask layer is a hard mask layer, and is defined as a second hard mask layer 19, and the second hard mask layer 19 has the same ONO structure as the first hard mask layer 18, and comprises a silicon dioxide layer 191, a silicon nitride layer 192, and a silicon dioxide layer 193, which are sequentially arranged from bottom to top, as shown in FIG. 6;

defining an area of a second trench 20 by utilizing the second hard mask layer 19, and etching the area of the second trench 20 to form the second trench 20 located in the substrate 11 at the periphery of the first trench 12, wherein the positions of the first trench 12 and the second trench 20 are staggered in the longitudinal direction, and a depth of the second trench 20 is generally less than that of the first trench 12, as shown in FIG. 7;

forming a gate oxide layer 151 on an inner surface of the second trench 20 by thermal oxidation, wherein a gate oxide layer 151 is formed on a sidewall of the second trench 20, and a thickness of the gate oxide layer 151 is, for example, 200-500 angstroms; and filling conductor materials on an inner surface of the gate oxide layer 151 by chemical vapor deposition to obtain a gate conducting layer, wherein filling polysilicon to obtain a polysilicon layer 152 and filling the remaining space of the second trench 20 with polysilicon, wherein the trench gate 15 comprises the gate oxide layer 151 and the polysilicon layer 152, and the gate oxide layer 151 is located in the second trench 20, wherein a surface planarization process is performed to expose an upper surface of the trench gate 15 by chemical-mechanical polishing.

Figure 8:
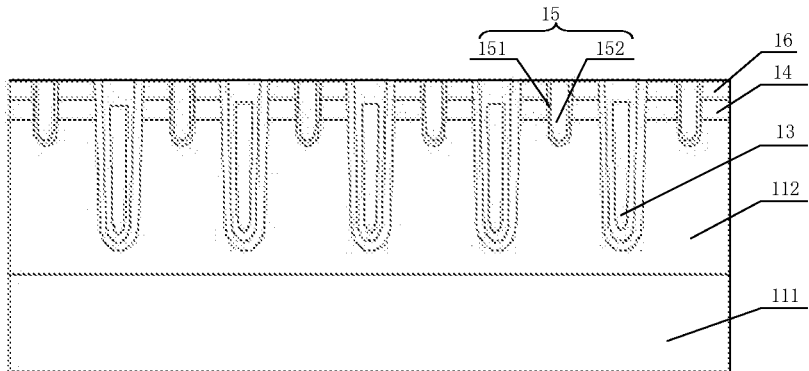
FIG. 8 shows a schematic structural diagram illustrating a step of forming an active region.

After forming the trench gate 15, ion implantation and high-temperature annealing are utilized to form the active region 16. The active region 16 is located above the well region 14, as shown in FIG. 8.

Figure 9:
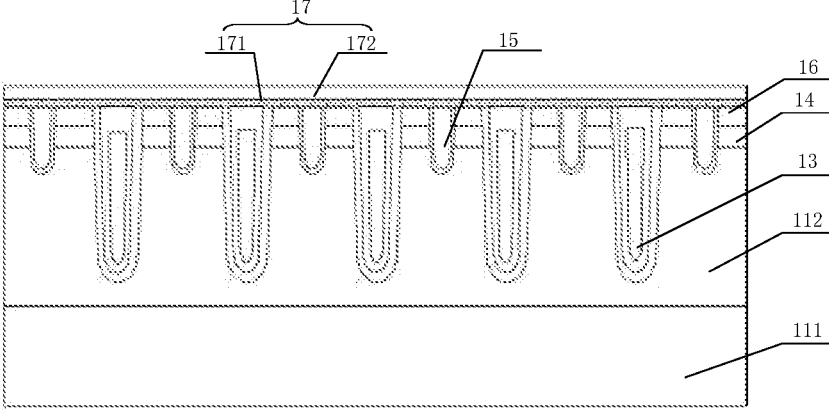
FIG. 9 shows a schematic structural diagram illustrating a step of forming an interlayer dielectric layer.

Step S4 comprises: forming an interlayer dielectric layer 17 covering the column 13, the trench gate 15, and the active region 16, as shown in FIG. 9.

The interlayer dielectric layer 17 may be a singular structural layer, or may be a composite structural layer comprising a silicon dioxide layer 171 and a boron-phosphorus-silicon glass layer 172. A thickness of the silicon dioxide layer 171 is preferably 2000-2500 angstroms, and is used to buffer stresses between layers adjacent to the silicon dioxide layer 171. A thickness of the boron-phosphorus-silicon glass layer 172 is preferably 8000-9000 angstroms.

Figure 10:
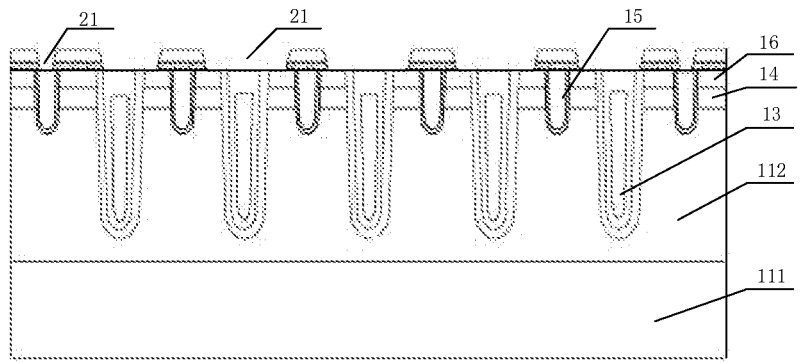
FIG. 10 shows a schematic structural diagram illustrating a step of forming a plurality of contact holes.
Figure 11:
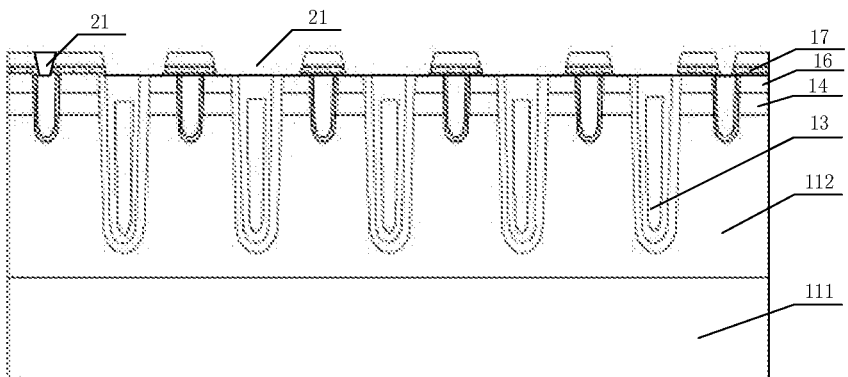
FIG. 11 shows a schematic structural diagram illustrating a step of forming an interconnection metal layer over the contact holes.
Figure 12:
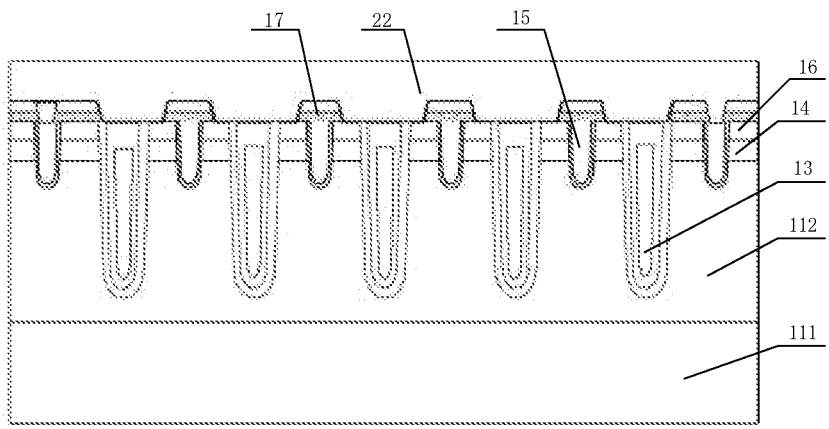
FIG. 12 shows a schematic structural diagram illustrating a step of forming a front metal layer.

Step S5 comprises: electrically leading out the column 13, the trench gate 15, and the active region 16. Specifically, S5 comprises:

forming a plurality of contact holes 21 in the interlayer dielectric layer 17 by etching, so as to expose the trench gate 15 and the column 13, as shown in FIG. 10;

forming an adhesion layer and an interconnection metal layer in sequence over the contact holes 21 by physical vapor deposition, as shown in FIG. 11, wherein the adhesion layer may be configured as a titanium layer and/or a titanium nitride layer, the interconnection metal layer may be configured as a copper layer and/or a copper alloy layer, wherein the adhesion layer may be configured as a tantalum layer and/or a tantalum nitride layer, the interconnection metal layer may be configured as a tungsten layer; and forming a front metal layer 22 covering the column 13 and the contact holes 21 by physical vapor deposition, as shown in FIG. 12, wherein the front metal layer 22 may be configured as a copper layer and/or an aluminum-copper alloy layer.

Figure 13:
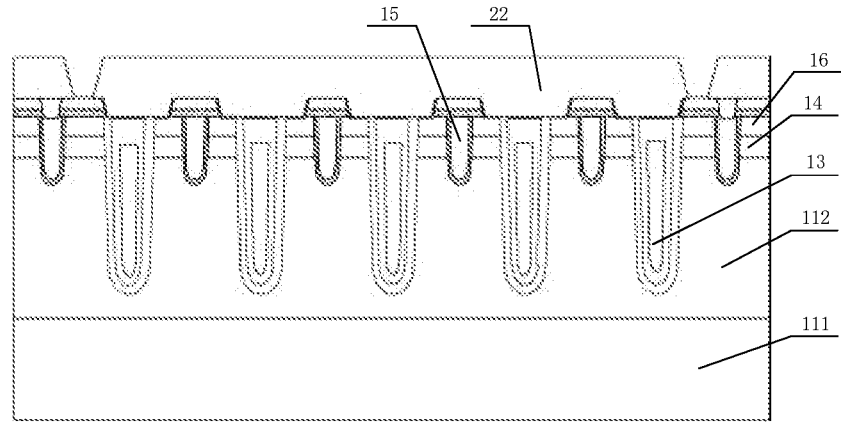
FIG. 13 shows a schematic structural diagram after etching the front metal layer.

In order to electrically lead out the column 13, the trench gate 15, and the active region 16, the front metal layer 22 is etched to form an opening that penetrates the front metal layer 22, as shown in FIG. 13.

Figure 14:
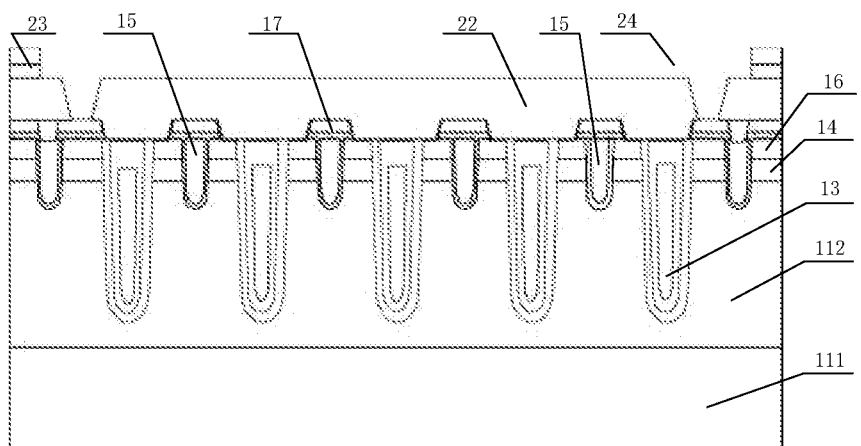
FIG. 14 shows a schematic structural diagram illustrating a step of forming a passivation layer and a pad window.

A passivation layer 23 over the front metal layer 22 is formed, and a pad window 24 that penetrates the passivation layer 23 is formed. The passivation layer 23 may be a single-layer or multi-layer structure. For example, the passivation layer 23 may only include a silicon nitride layer, or include both a silicon nitride layer and a polymer layer located on the silicon nitride layer. The silicon nitride layer can be formed by chemical vapor deposition, while the polymer layer can be formed by spin coating. The passivation layer 23 is used to better protect structures beneath it. Then, the passivation layer 23 is etched to form the pad window 24, as shown in FIG. 14.

Figure 15:
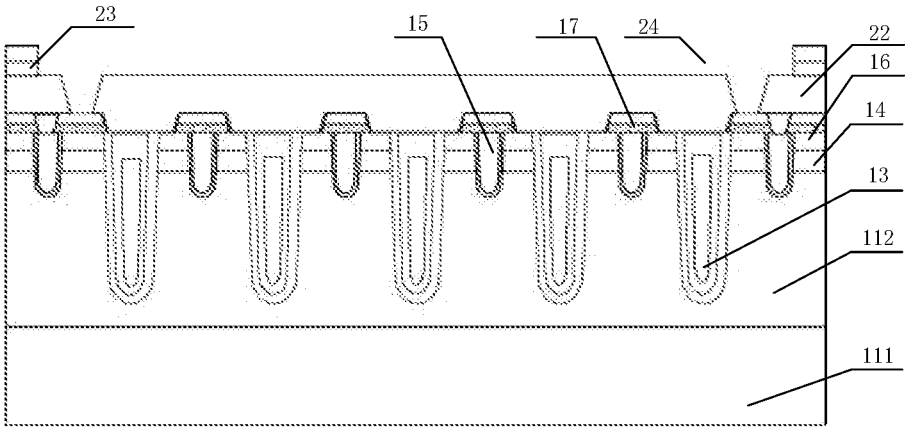
FIG. 15 shows a schematic structural diagram illustrating a step of thinning a surface of the substrate facing away from the column.

A thinning process can be performed on a surface of the substrate 11 facing away from the column 13 (i.e., a bottom surface of the base 111) to obtain a thinned substrate, as shown in FIG. 15. Then, a backside metallization process is performed on the thinned substrate to form a back metal layer (not shown). The back metal layer may comprise one or more material layers, such as a copper layer, a gold layer, and a nickel layer. An adhesion layer may also be formed between the back metal layer and the substrate 11, and the adhesion layer may be a titanium layer and/or a titanium nitride layer.

The present disclosure also provides a super junction trench MOSFET, which is prepared by utilizing a method for preparing a super junction trench MOSFET according to any of the above method embodiments. More details may be found in the method embodiments. FIG. 15 shows a structure of the super junction trench MOSFET. The super junction trench MOSFET comprises a plurality of columns of a second dopant type, which are distributed in a substrate at intervals to form a super-junction structure. The substrate is of a first dopant type. That is, when the substrate is of the N type, the columns will be of the P type. The super junction trench MOSFET further comprises one or more well regions, one or more trench gates, and one or more active regions. One of the trench gates is located in the substrate at a periphery of each column. Compared to similar devices prepared using existing technologies, the super junction trench MOSFET provided by the present disclosure has the following advantages: each of the columns have a gradient concentration and an air gap, which leads to better morphology and quality. Therefore, the performance of the device can be further improved, and the production cost can be effectively reduced.

In summary, the present disclosure provides a super junction trench MOSFET and a method for preparing the same. The method comprises: providing a substrate, and forming a first trench in the substrate, wherein the substrate is of a first dopant type; depositing an epitaxial portion of a first stage in the first trench while supplying a doped gas and an etching gas, and performing an epitaxial process after stopping supplying the doped gas and the etching gas, wherein impurities in the epitaxial portion of the first stage are diffused to an upper portion of the first trench and to form an epitaxial portion of a second stage with a gradient concentration by utilizing a high-temperature environment of the epitaxial process, wherein a top of the first trench is sealed by the impurities forming a column of a second dopant type, wherein the first dopant type is N type and the second dopant type is P type, or the first dopant type is P type and the second dopant type is N type; forming a well region, a trench gate, and an active region in the substrate at a periphery of the first trench, wherein the well region is of the second dopant type and the active region is of the first dopant type, wherein the trench gate penetrates the well region and extends downward into the substrate, and the active region is adjacent to the well region; forming an interlayer dielectric layer covering the column, the trench gate, and the active region; and electrically leading out the column, the trench gate, and the active region. The method of the present disclosure takes advantages of both trench epitaxial growth and characteristics of super junction devices, and divides the trench epitaxial growth into two stages. The epitaxial portion of the first stage and the column of the second dopant type are in charge balance, and the top of the trench is sealed during the second stage. The above-mentioned method can greatly reduce the process time, lower production costs, and prevent voids forming at the epitaxial portion when sealing the top of the deep trench, which leads to a column with better morphology and higher quality, thereby improving the performance of the device. Therefore, the present disclosure effectively overcomes various shortcomings in the existing technology and has high industrial utilization value.

The above-mentioned embodiments are for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the scope of the present disclosure.

What is claimed is:

1. A method for preparing a super junction trench MOSFET, comprising:

providing a substrate, and forming a first trench in the substrate, wherein the substrate is of a first dopant type; depositing an epitaxial portion of a first stage in the first trench while supplying a doped gas and an etching gas, and performing an epitaxial process after stopping supplying the doped gas and the etching gas, wherein impurities in the epitaxial portion of the first stage are diffused to an upper portion of the first trench and to form an epitaxial portion of a second stage with a gradient concentration by utilizing a high-temperature environment of the epitaxial process, wherein a top of the first trench is sealed by the impurities forming a column of a second dopant type, wherein the first dopant type is N type and the second dopant type is P type, or the first dopant type is P type and the second dopant type is N type;

forming a well region, a trench gate, and an active region in the substrate at a periphery of the first trench, wherein the well region is of the second dopant type and the active region is of the first dopant type, wherein the trench gate penetrates the well region and extends downward into the substrate, and the active region is adjacent to the well region;

forming an interlayer dielectric layer covering the column, the trench gate, and the active region; and electrically leading out the column, the trench gate, and the active region.

2. The method according to claim 1, wherein forming the first trench in the substrate comprises:

forming a first hard mask layer with an ONO structure on the substrate;

defining an area of the first trench by utilizing the first hard mask layer, and etching the area of the first trench to form the first trench; and removing a residual part of the first hard mask layer.

3. The method according to claim 1, wherein forming the trench gate in the substrate at the periphery of the first trench comprises:

forming a second hard mask layer covering the well region and the column;

defining an area of a second trench by utilizing the second hard mask layer, and etching the area of the second trench to form the second trench;

forming a gate oxide layer on an inner surface of the second trench;

filling polysilicon on an inner surface of the gate oxide layer to obtain a polysilicon layer, wherein the trench gate comprises the gate oxide layer and the polysilicon layer; and performing a surface planarization process to expose an upper surface of the trench gate.

4. The method according to claim 1, wherein the interlayer dielectric layer comprises a silicon dioxide layer and a boron-phosphorus-silicon glass layer, wherein a thickness of the silicon dioxide layer is 2000-2500 angstroms, and a thickness of the boron-phosphorus-silicon glass layer is 8000-9000 angstroms.

5. The method according to claim 1, wherein electrically leading out the column, the trench gate, and the active region comprises:

forming a plurality of contact holes in the interlayer dielectric layer to expose the trench gate and the column;

forming an adhesion layer and an interconnection metal layer in sequence over the contact holes;

forming a front metal layer covering the column and the contact holes; and forming a passivation layer over the front metal layer, and forming a pad window penetrating the passivation layer.

6. The method according to claim 5, wherein the adhesion layer comprises a titanium layer and/or a titanium nitride layer, the interconnection metal layer comprises a tungsten layer or a copper layer, the passivation layer comprises a silicon nitride layer, and the front metal layer comprises an aluminum-copper alloy layer.

7. The method according to claim 1, wherein the method further comprises: performing thinning and backside metallization processes in sequence on a surface of the substrate facing away from the column.

8. The method according to claim 1, wherein a thickness of the epitaxial portion of the first stage is 25%-40% of a depth of the first trench.

9. The method according to claim 1, wherein during the first stage, a flow rate of the doped gas is 700-1000 sccm, a flow rate of the etching gas is 1200-1400 sccm, and a duration for deposition is 1 μm/deposition rate.

\* \* \* \* \*